United States Patent
Choi

(10) Patent No.: US 6,940,567 B2
(45) Date of Patent: Sep. 6, 2005

(54) LIQUID CRYSTAL DISPLAY DEVICE HAVING REDUCED OPTICAL PUMPING CURRENT AND METHOD OF FABRICATING THE SAME

(75) Inventor: Woo Hyuk Choi, Daegu (KR)

(73) Assignee: LG. Philips LCD Co., Ltd., Seoul (KR)

( * ) Notice: Subject to any disclaimer, the term of this patent is extended or adjusted under 35 U.S.C. 154(b) by 59 days.

(21) Appl. No.: 10/638,497

(22) Filed: Aug. 12, 2003

(65) Prior Publication Data
US 2004/0051823 A1 Mar. 18, 2004

(30) Foreign Application Priority Data
Sep. 17, 2002 (KR) ............................... 10-2002-0056502

(51) Int. Cl.7 ...................... G02F 1/136; G02F 1/1343; G02F 1/13; H01L 29/04
(52) U.S. Cl. ........................ 349/43; 349/139; 349/143; 349/187; 257/59
(58) Field of Search ........................... 349/42, 43, 139, 349/141, 143, 187; 257/59, 72

(56) References Cited

U.S. PATENT DOCUMENTS

| | | | |
|---|---|---|---|
| 6,680,772 B2 * | 1/2004 | Lee ............................. | 349/141 |
| 2001/0043292 A1 * | 11/2001 | Tsujimura et al. ............. | 349/43 |
| 2002/0113916 A1 * | 8/2002 | Hashiguchi et al. ........... | 349/43 |
| 2002/0186331 A1 * | 12/2002 | Chung ......................... | 349/43 |
| 2003/0227579 A1 * | 12/2003 | Nakahori et al. ............. | 349/43 |
| 2004/0021816 A1 * | 2/2004 | Jeong et al. ................. | 349/117 |
| 2004/0090564 A1 * | 5/2004 | Lee ............................ | 349/43 |

* cited by examiner

Primary Examiner—Tarifur R. Chowdhury
(74) Attorney, Agent, or Firm—Morgan, Lewis & Bockius LLP

(57) ABSTRACT

The present invention relates to a liquid crystal display and a method of fabricating the same that is capable of reducing an optical pumping current. The liquid crystal display comprises a gate line having a bending part in at least one side, a data line crossing the gate line on the first substrate, a pixel electrode formed at a pixel area defined by the gate line and the data line, a drain electrode of a thin film transistor connected to the pixel electrode, and a semiconductor layer overlapping at least a part of the gate line, the drain electrode, and the data line to form a channel of the thin film transistor, wherein the bending part is disposed between the drain electrode and the data line.

19 Claims, 12 Drawing Sheets

LIGHT

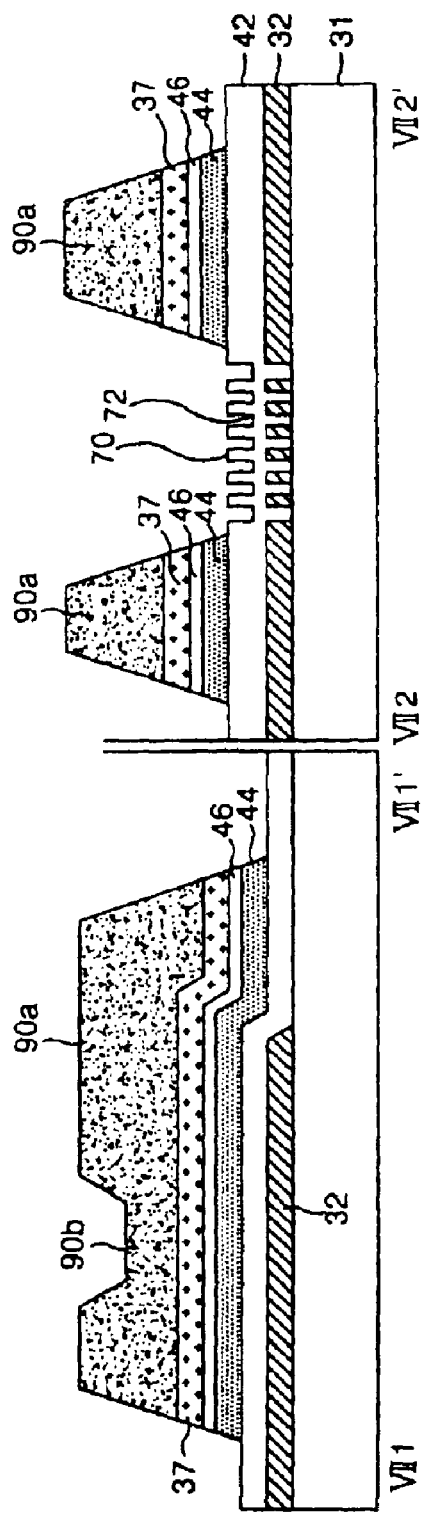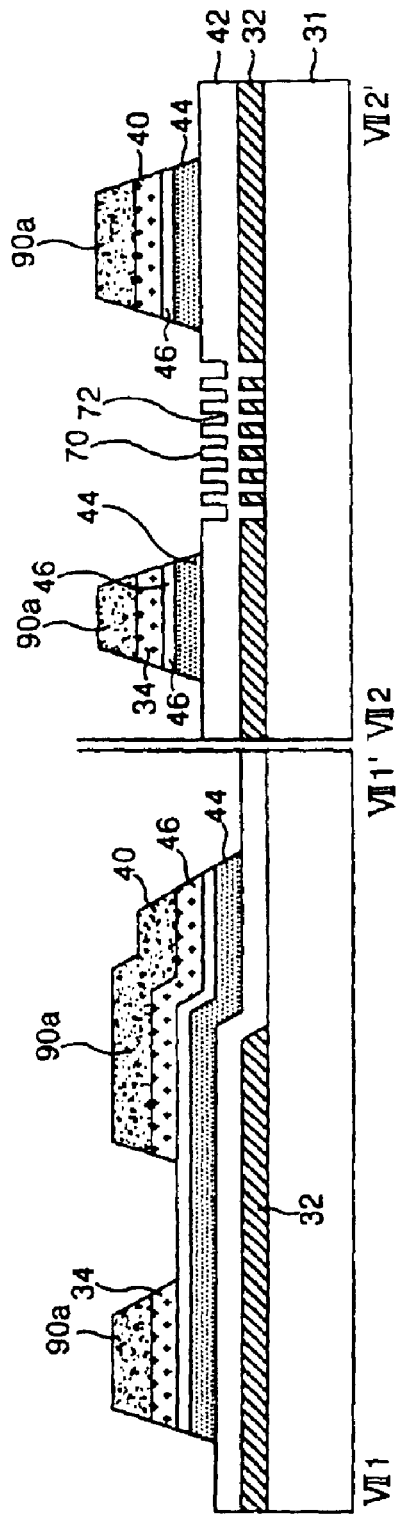

LIQUID CRYSTAL DISPLAY DEVICE HAVING REDUCED OPTICAL PUMPING CURRENT AND METHOD OF FABRICATING THE SAME

The present invention claims the benefit of Korean Patent Application No. 2002-56502 filed in Korea on Sep. 17, 2002, which is hereby incorporated by reference.

BACKGROUND OF THE INVENTION

1. Field of the Invention

The present invention relates to a display device and a method of fabricating a display device, and more particularly to a liquid crystal display device and a method of fabricating a liquid crystal display device.

2. Description of the Related Art

In general, liquid crystal display (LCD) devices control light transmittance through a liquid crystal material by application of an electric field. The LCD devices include a liquid crystal display panel having liquid crystal cells arranged in a matrix configuration, and a drive circuit to drive the liquid crystal display panel. Pixel electrodes and common electrodes are provided in the liquid crystal display panel to supply the electric field to each of the liquid crystal cells. The pixel electrode is formed on a lower substrate and the common electrode is formed on an entire surface of an upper substrate, wherein each pixel electrode is connected to a thin film transistor (TFT) to be used as a switching device. Accordingly, the pixel electrode drives the liquid crystal cell together with the common electrode in accordance with data signals supplied through the thin film transistor.

Fabrication of the lower substrate of the LCD device requires a plurality of mask and semiconductor processes, which are major factors in fabricating costs of the liquid crystal display panel. To solve this, a fabrication method for the lower substrate has a reduced number of mask processes. For example, one mask process includes several different processes, such as deposition, cleaning, photolithography, etching, exfoliation, and testing.

FIG. 1 is a plan view of a lower substrate of a liquid crystal display according to the related art, and FIG. 2 is a cross sectional view along II–II' of FIG. 1 according to the related art. In FIG. 1, a lower substrate 1 (in FIG. 2) includes a TFT 30 located at each intersection part of the data lines 4 and the gate lines 2, and a pixel electrode 22 connected to the drain electrode 10 of the TFT 30.

In FIGS. 1 and 2, the TFT 30 includes a gate electrode 6 connected to the gate line 2, a source electrode 8 connected to the data line 4, and a drain electrode 10 connected to the pixel electrode 22 through a drain contact hole 20. In addition, the TFT 30 includes semiconductor layers 14 and 16 to form a conductive channel between the source and drain electrodes 8 and 10 by a gate voltage supplied to the gate electrode 6. Accordingly, the TFT 30 selectively supplies a data signal from the data line 4 to the pixel electrode 22 in response to a gate signal from the gate line 2.

The pixel electrode 22 is located at a cell area divided by the data line 4 and the gate line 2, and is formed of a transparent conductive material having high light transmittance. The pixel electrode 22 is formed on a protective layer 18 spread on an entire surface of the lower substrate 1, and is electrically connected to the drain electrode 10 through a drain contact hole 20 formed in the protective layer 18. A potential difference is generated between the pixel electrode 22 and a common electrode (not shown) formed in an upper substrate (not shown) by the data signal supplied through the TFT 30. The potential difference causes liquid crystal molecules located between the lower substrate 1 and the upper substrate (not shown) to rotate due to dielectric constant anisotropy. The rotated liquid crystal molecules allow transmission of light through the pixel electrode 22 from a light source toward the upper substrate (not shown).

FIGS. 3A to 3D are cross sectional views of a method of fabricating the lower substrate of FIG. 2 according to the related art. In FIG. 3A, the gate electrode 6 and the gate line 2 are formed on the lower substrate 1. For example, a gate metal layer including aluminum or an aluminum alloy is deposited on the lower substrate 1 by a deposition method, such as sputtering. Then, the gate metal layer is patterned by photolithographic and etching processes using a first mask to form the gate electrode 6 and the gate line 2 on the lower substrate 1.

In FIG. 3B, a gate insulating film 12, an active layer 14, an ohmic contact layer 16, a data line 4 (in FIG. 1), a source electrode 8, and a drain electrode 10 are formed on the lower substrate 1. For example, the gate insulating film 12, first and second semiconductor layers, and a data metal layer are sequentially formed on the lower substrate 1 by a deposition method, such as chemical vapor deposition or sputtering. The gate insulating film 12 is formed of an inorganic insulating material, such as silicon oxide SiOx or silicon nitride SiNx, the first semiconductor layer is formed of undoped amorphous silicon, the second semiconductor layer is formed of n-type or p-type amorphous silicon, and the data metal layer is formed of molybdenum Mo or an molybdenum alloy.

Next, a photoresist pattern is formed on the data metal layer using a second mask. For example, a halftone mask with a semi-transmitting part corresponding to a channel part of the TFT is used as the second mask, whereby the semi-transparent part of the photoresist pattern has a height lower than a height of the photoresist pattern corresponding to source/drain electrodes. Then, the data metal layer is patterned by a wet etching process using the photoresist pattern, whereby the data line 4 and the source and drain electrodes 8 and 10 are formed. Finally, the first and second semiconductors are simultaneously patterned by a dry etching process using the photoresist pattern to form an active layer 14 and an ohmic contact layer 16.

Next, the semi-transparent part of the photoresist pattern is removed by an ashing process, and the source/drain pattern and the ohmic contact layer corresponding to the channel part are etched by the etching process and the dry etching process. Accordingly, the active layer of the channel part is exposed to separate the source and drain electrodes 8 and 10. Then, the remaining photoresist pattern is removed from the source and drain electrodes 8 and 10 by a stripping process.

In FIG. 3C, a protective film 18 is formed over an entire surface of the lower substrate 1, wherein a drain contact hole 20 is formed to expose a portion of the drain electrode 10. For example, an insulating material formed of an inorganic insulating material, such as silicon oxide SiOx and silicon nitride SiNx, or an organic insulating material, such as acrylic organic compound, benzocyclobutene BCB, and perfluorocyclobutane PFCB, is deposited on the gate insulating film 12 provided with the source electrode 8, the drain electrode 10 and the data line to form the protective film 18. Subsequently, the protective film 18 is patterned by photolithographic and etching processes using a third mask to form the drain contact hole 20.

In FIG. 3D, a pixel electrode 22 is formed on the protective film 18 by depositing a transparent metal layer, such as indium-tin-oxide ITO, indium-zinc-oxide IZO, or indium-tin-zinc-oxide ITZO, on the protective film 18. Subsequently, the transparent metal layer is patterned by photolithographic and etching processes using a fourth mask to form the pixel electrode 22. Accordingly, the pixel electrode 22 is connected to the drain electrode 10 through the drain contact hole 20 formed in the protective film 18.

FIG. 4 is a cross sectional view of area P1 of FIG. 1 according to the related art. In FIG. 4, the data line 4 and the drain electrode 10 are formed with a specific gap therebetween at an area corresponding to an end projected part of the gate electrode 6. Accordingly, a short circuit often occurs due to a pattern defect between an active layer 14A formed at a lower part of the data line 4 and an active layer 14B formed at a lower part of the drain electrode 10 in an area except the gate electrode. Thus, a channel is formed due to the short circuit and receives light generated by a backlight device, wherein optical pumping current increases within the active layer 14. In addition, a voltage charged in the pixel electrode 22 (in FIG. 1) is discharged to the data line 4 through the channel, and a bright spot is generated since the voltage charged in the pixel electrode 22 becomes lower relatively.

FIG. 5 a cross sectional view along V–V' of FIG. 1 according to the related art. In FIG. 5, since the gate electrode 6 cannot sufficiently cover the active layer 14 formed at the lower part of the source electrode 8, the active layer 14 receives the light generated by the backlight device to further increase the optical pumping current within the active layer 14. Accordingly, OFF-current of the TFT 30 increases.

SUMMARY OF THE INVENTION

Accordingly, the present invention is directed to a liquid crystal display device and a method of fabricating a liquid crystal display device that substantially obviates one or more of the problems due to limitations and disadvantages of the related art.

An object of the present invention is to provide a liquid crystal display device having a reduced optical pumping current.

Another object of the present invention is to provide a method of fabricating a liquid crystal display device having a reduced optical pumping current.

Additional features and advantages of the present invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device includes a gate line having a dot matrix pattern on a first substrate, a data line crossing the gate line on the first substrate, a pixel electrode formed at a pixel area defined by the gate line and the data line, a drain electrode of a thin film transistor connected to the pixel electrode, and a semiconductor layer overlapping at least part of the gate line, the drain electrode, and the data line to form a channel of the thin film transistor, wherein the dot matrix pattern is disposed between the drain electrode and the data line.

In another aspect, a method of fabricating a liquid crystal display device includes forming a gate line having a plurality of dot patterns on a first substrate, forming a gate insulating film to cover the gate line on the first substrate, forming a semiconductor layer having a first width overlapping a second width of the gate line, the first width less than the second width, forming a data line crossing the gate line, forming a drain electrode facing the data line with the dot pattern therebetween, forming a protective film having a contact hole to expose the drain electrode, and forming a pixel electrode on the protective film connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 9A to 9D are cross sectional views of an exemplary method of fabricating the lower substrate of FIG. 8B according to the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
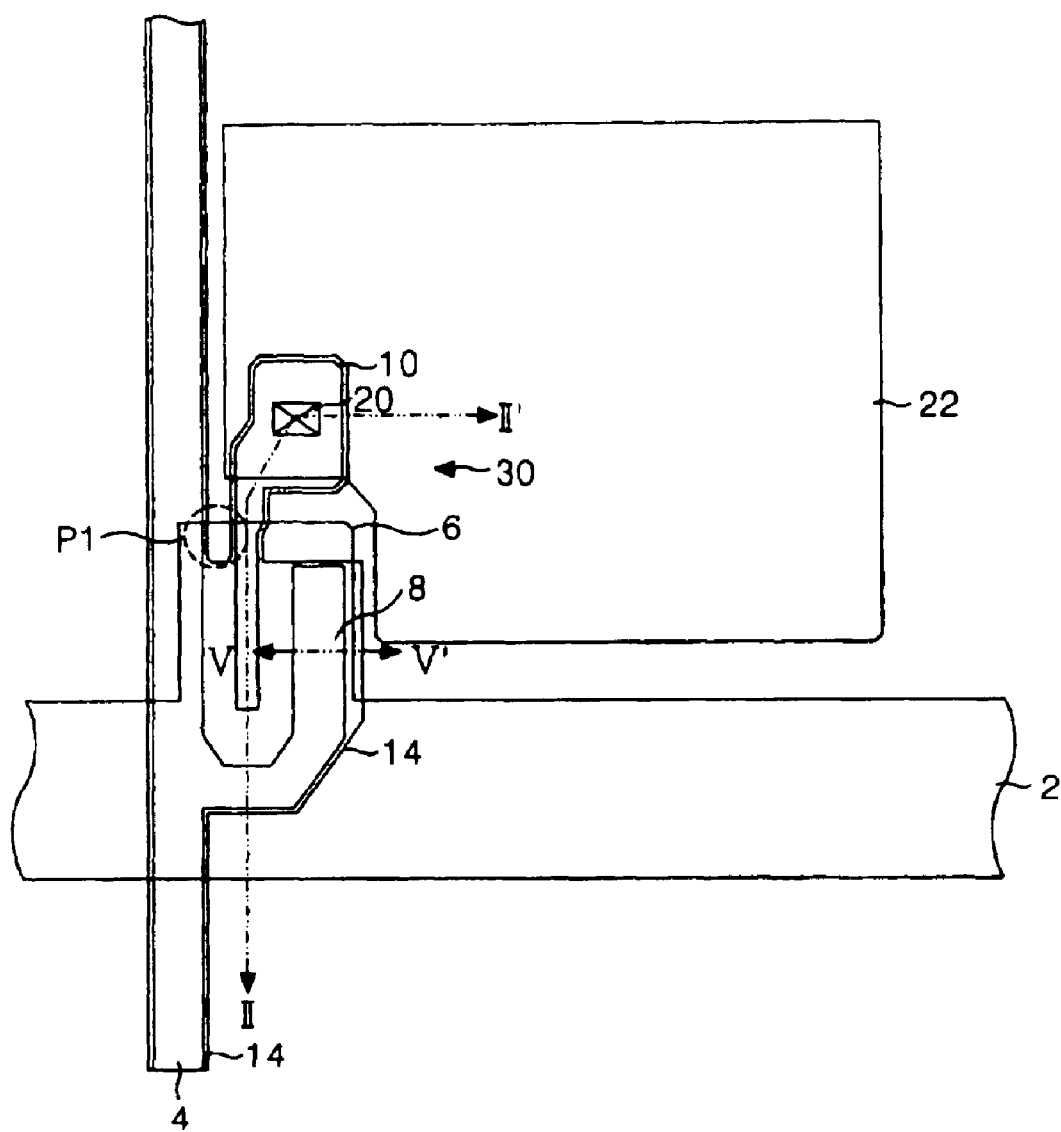
FIG. 1 is a plan view of a lower substrate of a liquid crystal display according to the related art.
Figure 2:
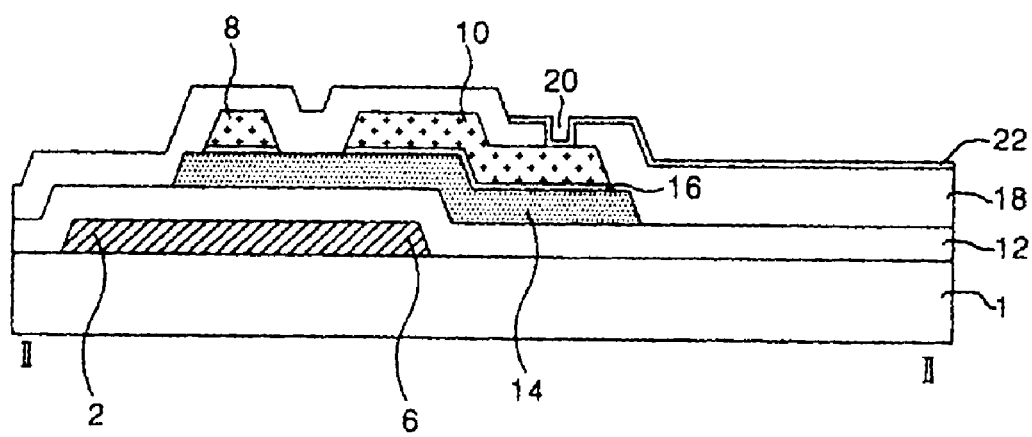
FIG. 2 is a cross sectional view along II–II' of FIG. 1 according to the related art.
Figure 3A:
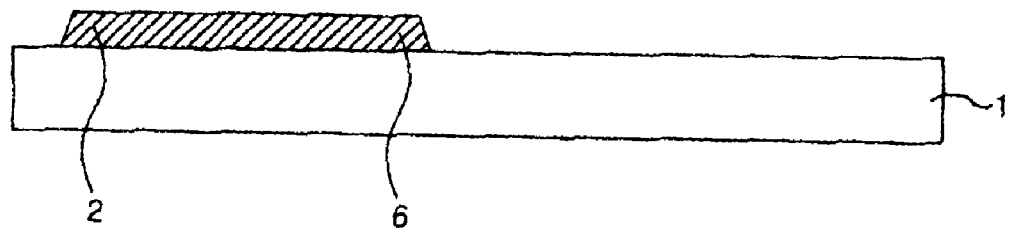
FIGS. 3A to 3D are cross sectional views of a method of fabricating the lower substrate of FIG. 2 according to the related art.
Figure 3B:
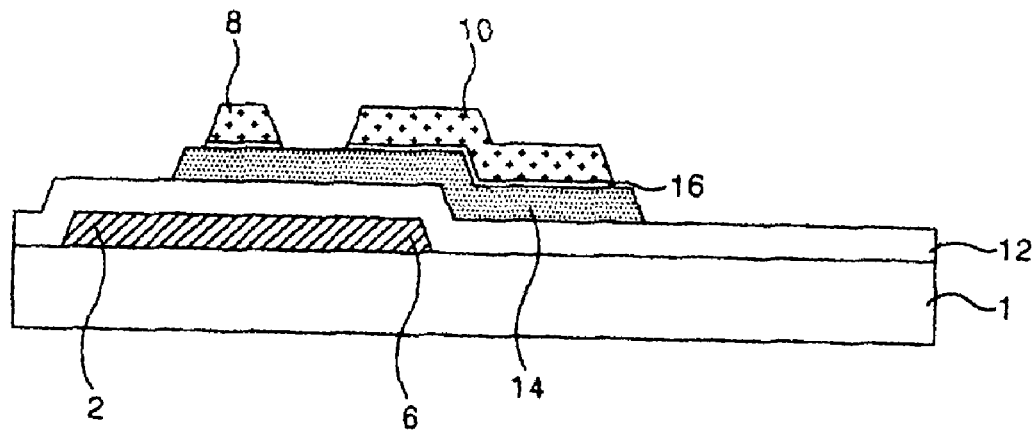
Figure 3C:
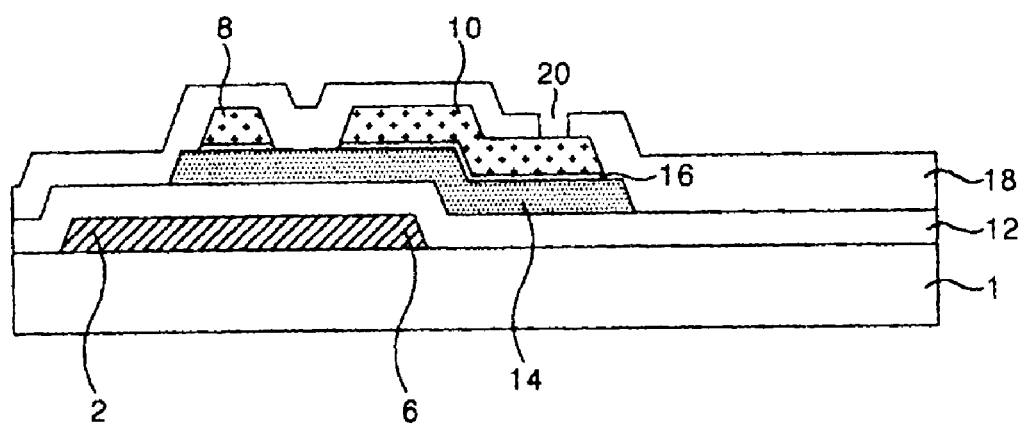
Figure 3D:
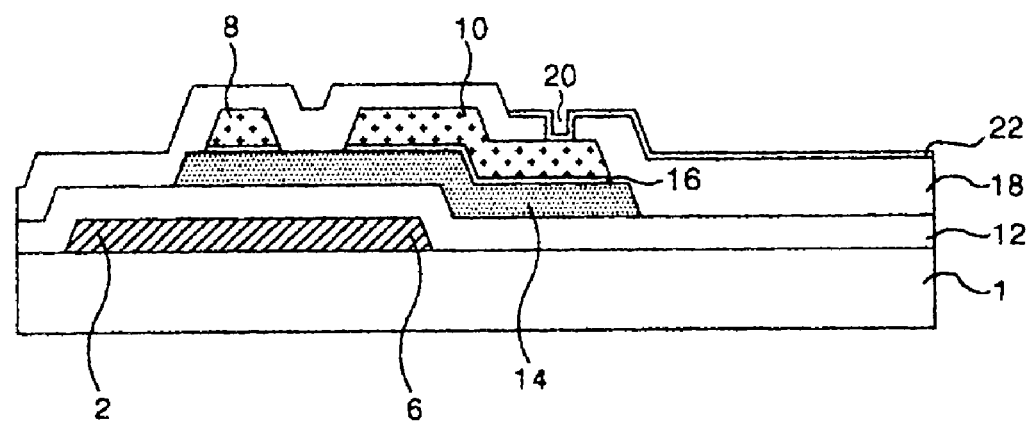
Figure 4:
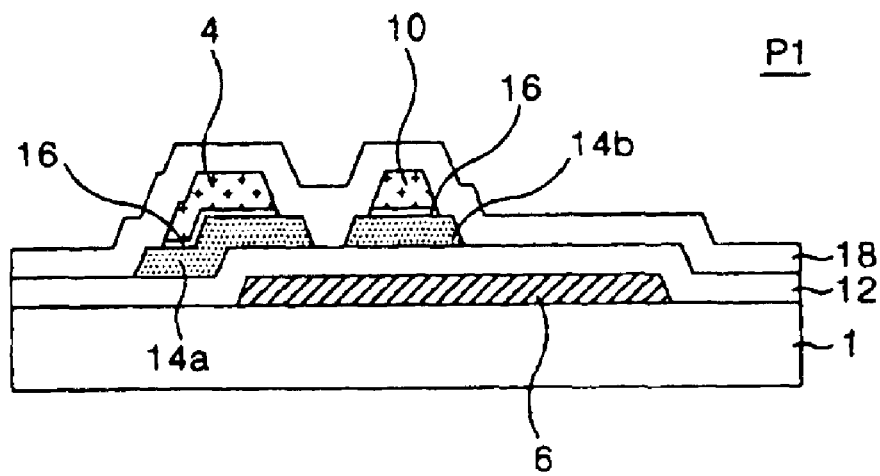
FIG. 4 is a cross sectional view of area P1 of FIG. 1 according to the related art.
Figure 5:
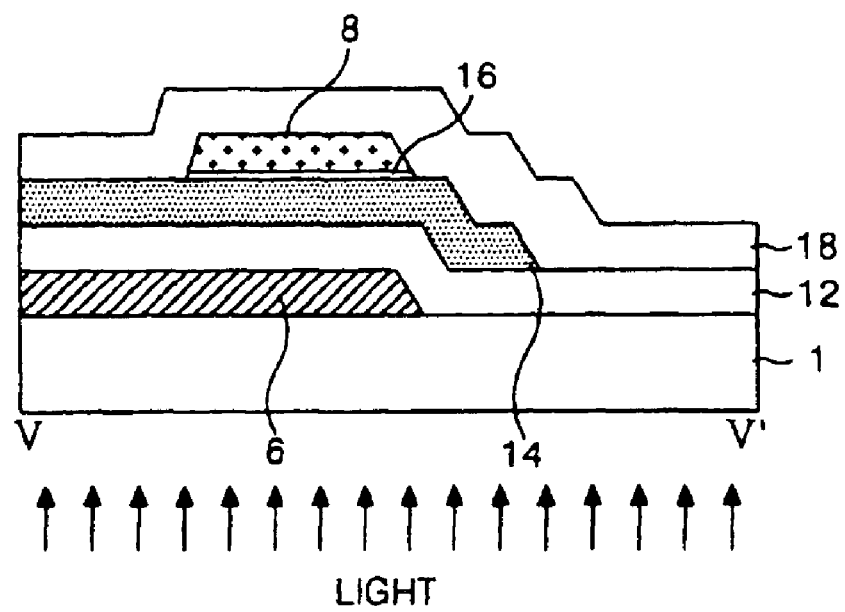
FIG. 5 a cross sectional view along V–V' of FIG. 1 according to the related art.
Figure 6:
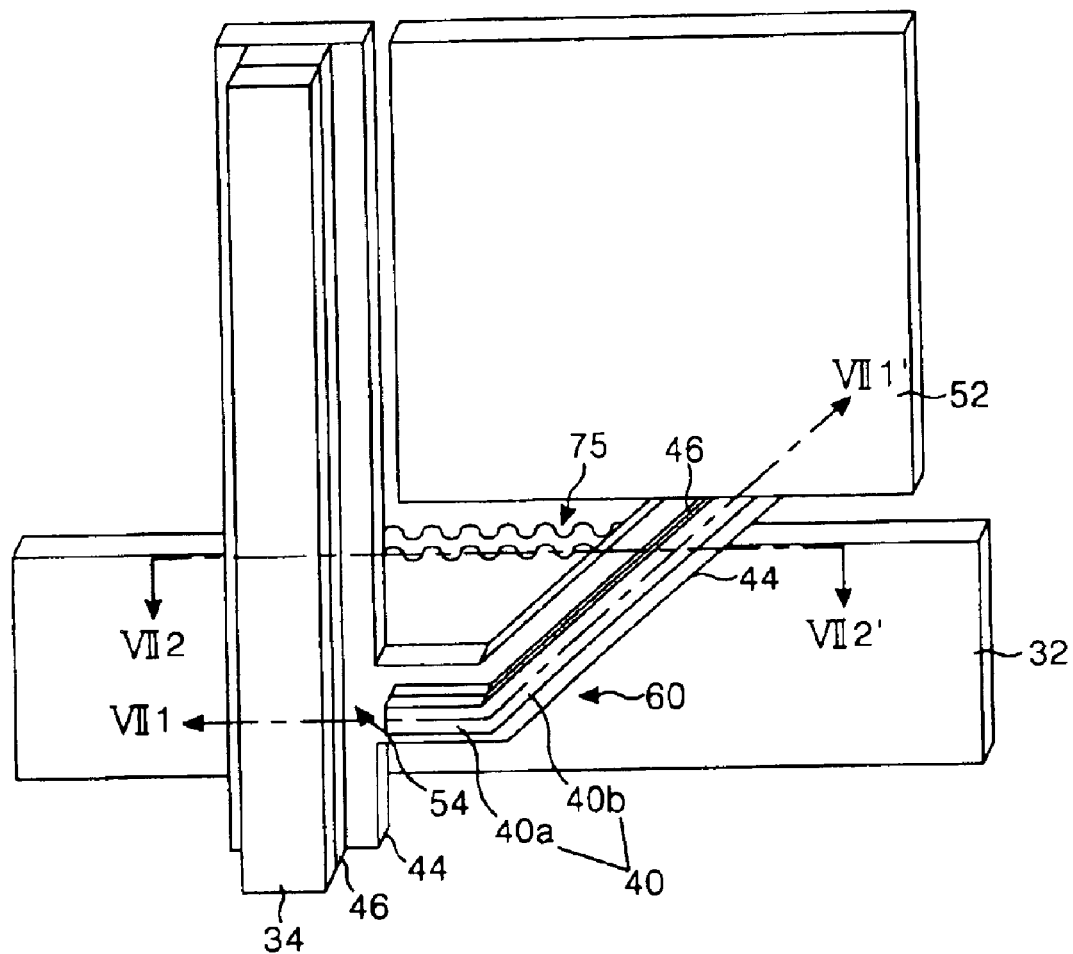
FIG. 6 is a plan view of an exemplary lower substrate of a liquid crystal display according to the present invention.
Figure 7:
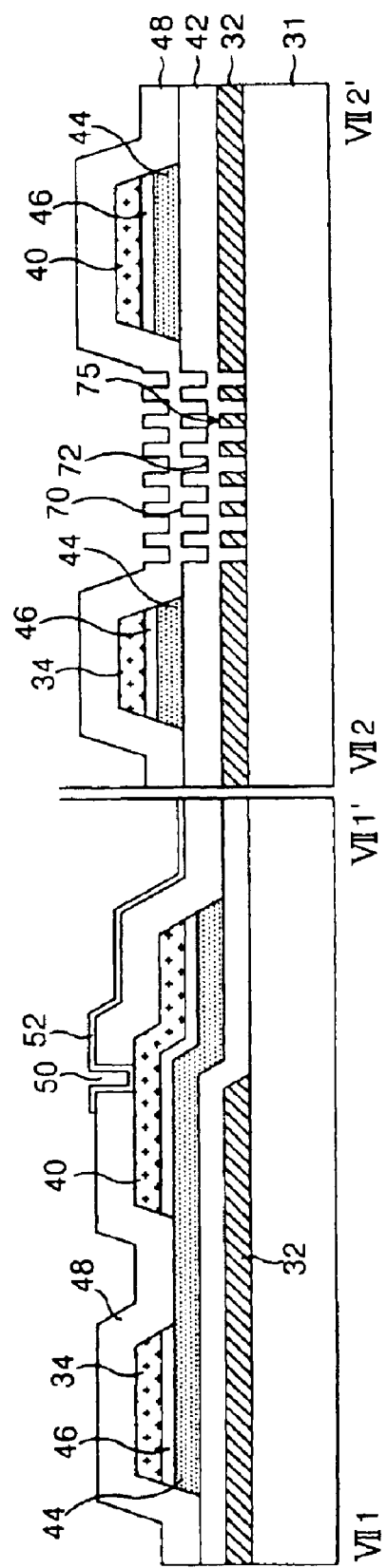
FIG. 7 are a cross sectional views along VII1–VII1' and VII2–VII2' of FIG. 6 according to the present invention.

FIG. 6 is a plan view of an exemplary lower substrate of a liquid crystal display according to the present invention, and FIG. 7 are cross sectional views along VII1–VII1' and VII2–VII2' of FIG. 6 according to the present invention.

In FIG. 6, a lower array substrate may include a plurality of gate lines 32 and data lines 34 formed to cross each other, wherein a TFT 60 may be formed on each of the gate lines 32 and a pixel electrode 52 may be connected to a drain electrode 40 of the TFT 60. The gate lines 32 may include a gate electrode of the TFT 60, wherein a gate signal may be supplied to the gate electrode. A portion of at least one side of the gate lines 32 may include a plurality of bending parts 75 formed between the data line 34 and a drain electrode 40.

In FIG. 7, a gate insulating film 42 may be formed to cover the gate line 32 and may formed by rugged form to include a plurality of convex parts 70 and may include a plurality of concave parts 72 provided at an area where the gate insulating film 42 overlaps the bending parts 75. Accordingly, the gate insulating film 42 increases a distance between a lower part of the data lines 34 and the drain electrode 40. Thus, a short circuit between adjacent active layers 44 formed at each lower part of the data lines 34 and the drain electrode 40 may be prevented The TFT 60 (in FIG. 6) may include a gate electrode included with the gate line 32, a source electrode included in the data line 34, and a drain electrode 40 connected to the pixel electrode 52. In addition, the TFT 60 may include semiconductor layers 44 and 46 to form a channel between the source electrode and the drain electrode 40 by supplying a gate signal to the gate electrode.

The gate electrode may be included with the gate line 32 to correspond to a gate line area that overlaps a channel 54 (in FIG. 6) between the source electrode and the drain electrode 40. The source electrode included in the data line 34 may correspond to a data line area that faces the drain electrode 40 with a channel therebetween. The drain electrode 40 may be connected to the pixel electrode 52 through a drain contact hole 50 formed in a protective layer 48.

In FIG. 6, the drain electrode 40 may include a first part 40A facing the data line 34 and extending along a direction of the gate line 32, and may include a second part 40B that may extend at an angle from the first part 40a to the pixel electrode 52. Accordingly, the channel 54 may be formed between the data line 34 and the first part 40a of the drain electrode 40.

The pixel electrode 52 may be located at a cell area divided by the data line 34 and the gate line 32, and may include transparent conductive material(s) having high light transmittance. The pixel electrode 52 may be formed on the protective layer 48, and may be electrically connected to the second part 40b of the drain electrode 40.

The LCD device according to the present invention may prevent generation of leakage current caused by activation of the active layer 44 by a backlight device by forming the gate line 32 to cover all of the channel 54 and the adjacent active layer 44.

Figure 8A:
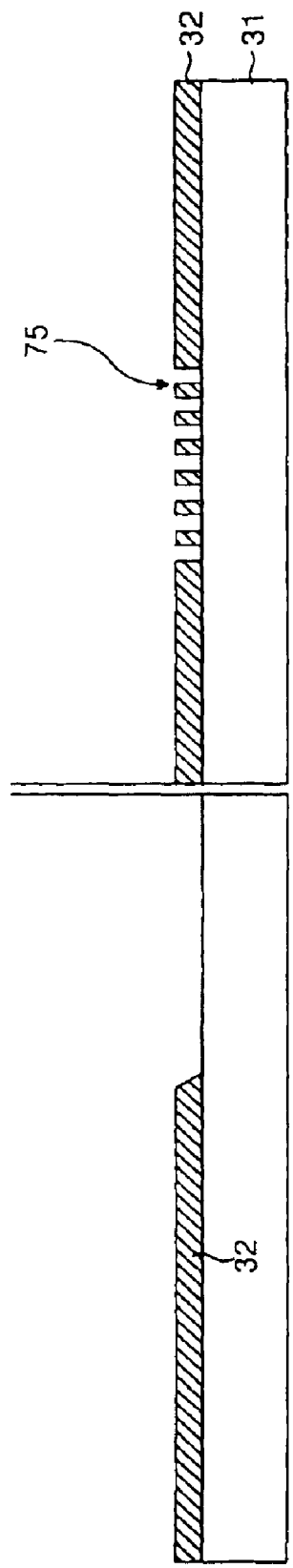
FIGS. 8A to 8D are cross sectional views of an exemplary method of fabricating a lower substrate of a liquid crystal display along VII1–VII1' and VII2–VII2' of FIG. 6 according to the present invention.

FIGS. 8A to 8D are cross sectional views of an exemplary method of fabricating a lower substrate of a liquid crystal display along VII1–VII1' and VII2–VII2' of FIG. 6 according to the present invention. In FIG. 8A, a gate line 32 including the gate electrode may be formed on a lower substrate 31. For example, a gate metal layer 32 may be deposited on the lower substrate 31 by a deposition method, such as sputtering. The gate metal layer may include aluminum and/or aluminum neodymium AlNd. Then, the gate metal layer may be patterned by photolithographic and etching processes to form the gate line 32 including the gate electrode. Accordingly, the gate line 32 between the drain electrode and the data line may be formed later to include a bending part 75 (in FIG. 6).

Figure 8B:
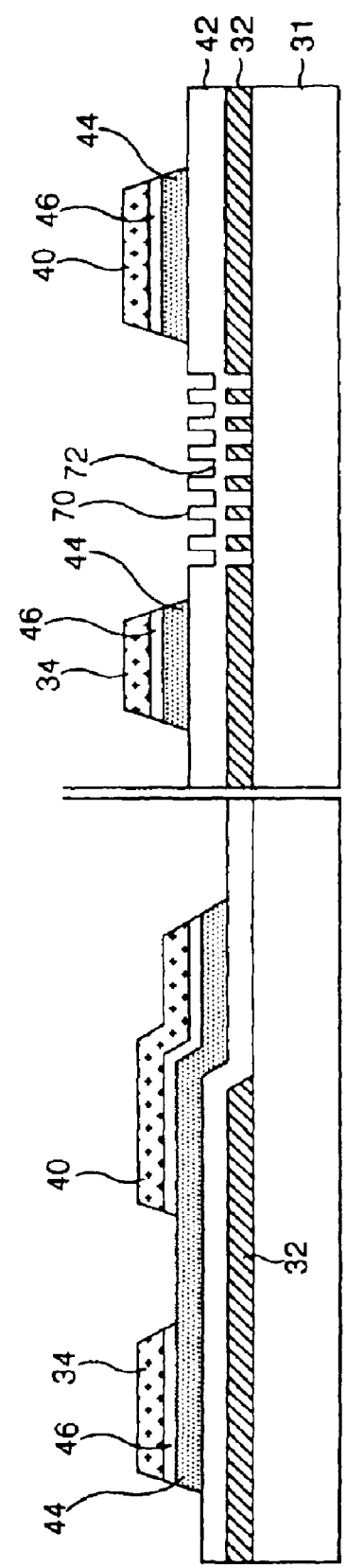

In FIG. 8B, a gate insulating film 42, an active layer 44, an ohmic contact layer 46, a drain electrode 40, and a data line 34 including a source electrode may be formed on the lower substrate 31 provided with the gate electrode and the gate line 32. For example, the gate insulating film 42, first and second semiconductor layers, and a data metal layer may be sequentially deposited on the lower substrate 31 by a deposition method, such as chemical vapor deposition and sputtering. In addition, the gate insulating film 42 may include a plurality of projections 70 and a plurality of grooves 72 corresponding to the projections 70. Thus, a dot pattern 75 (in FIG. 6) may be formed.

The gate insulating film 42 may include inorganic insulating material(s), such as silicon oxide SiOx or silicon nitride SiNx, the first semiconductor layer may include undoped amorphous silicon, the second semiconductor layer 47 may include n-type or p-type amorphous silicon, and the data metal layer may include molybdenum Mo and/or an molybdenum alloy.

Then, a second mask (not shown) may be aligned on the lower substrate 31 to pattern the first and second semiconductor layers and the data metal layer by photolithographic processes, which may include exposure and development processes, and etching processes. Accordingly, an active layer 44, an ohmic contact layer 46, a drain electrode 40, and a data line 34 including a source electrode may be formed on the lower substrate 31.

Figure 8C:
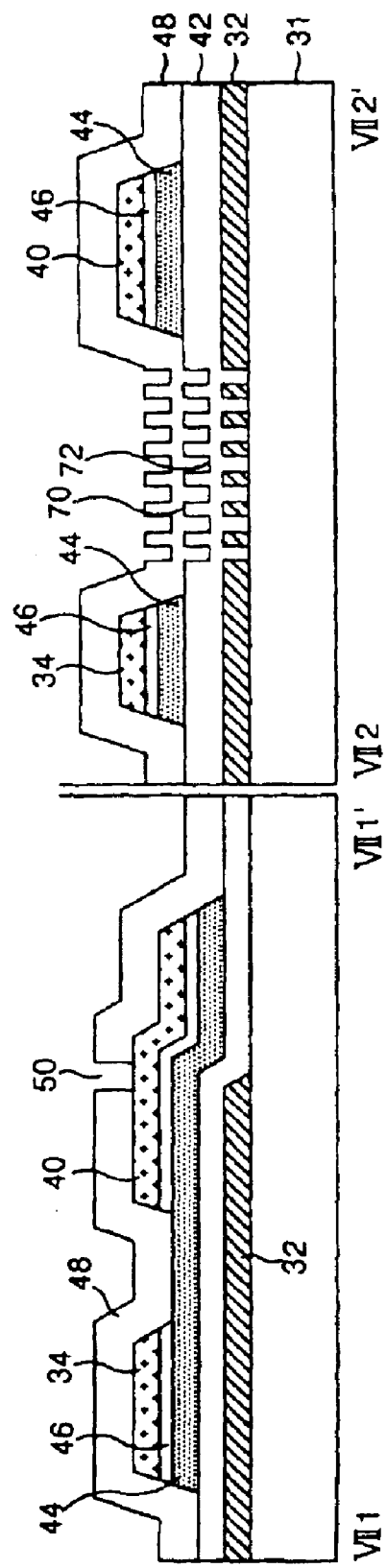

In FIG. 8C, a protective film 48 may be formed on the lower substrate 31 to cover the drain electrode 40 and the data line 34 including the source electrode. For example, the protective film 48 may be formed by depositing insulating material(s) on an entire surface of the lower substrate 31 where the data line 34 are the drain electrode 40 are formed. Accordingly, the protective film 48 may include projections and grooves corresponding to the projections 70 and grooves 72 of the gate insulating film 42. The protective film 48 may include inorganic insulating material(s), such as silicon oxide SiOx and/or silicon nitride SiNx, or organic insulating material(s), such as acrylic organic compound, benzocyclobutene BCB, and/or perfluorocyclobutane PFCB.

Then, the insulating material(s) may be patterned by photolithographic processes, which may include exposure and development processes, and etching processes using a third mask aligned on the lower substrate 31 to form a drain contact hole 50 in the protective film 48 to expose the drain electrode 40.

Figure 8D:
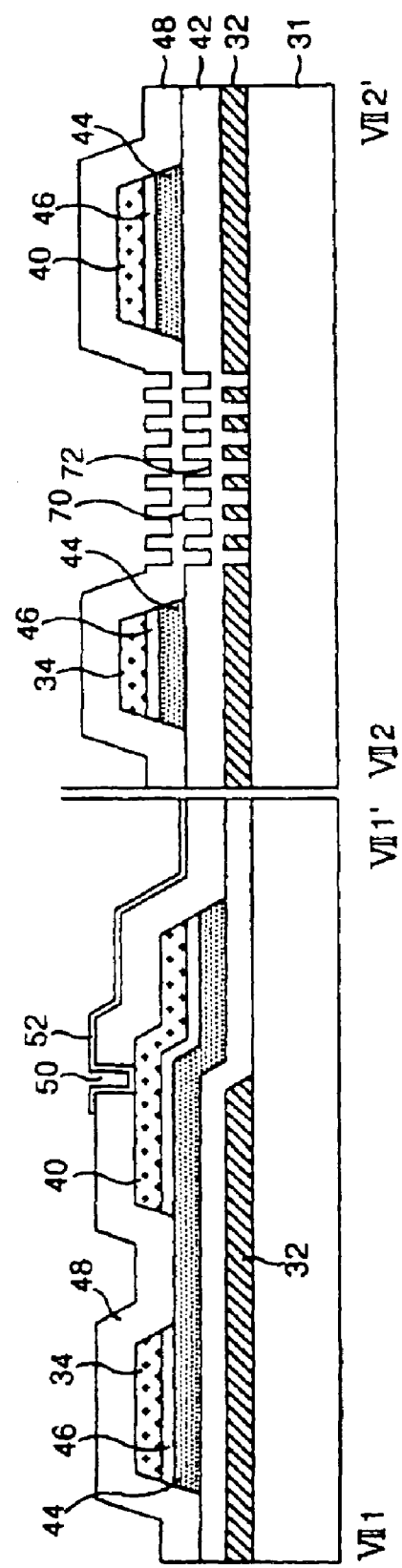

In FIG. 8D, a pixel electrode 52 may be formed on the lower substrate 31 provided with the protective film 48. For example, transparent conductive material(s) may be deposited on an entire surface of the protective film 48 by a deposition method, such as sputtering. The transparent conductive material(s) may include indium tin oxide ITO, indium zinc oxide IZO, and/or indium tin zinc oxide ITZO. Accordingly, the transparent conductive material(s) may be patterned by photolithographic and etching processes using a fourth mask aligned on the lower substrate 31 to form the pixel electrode 52.

Figure 9A:
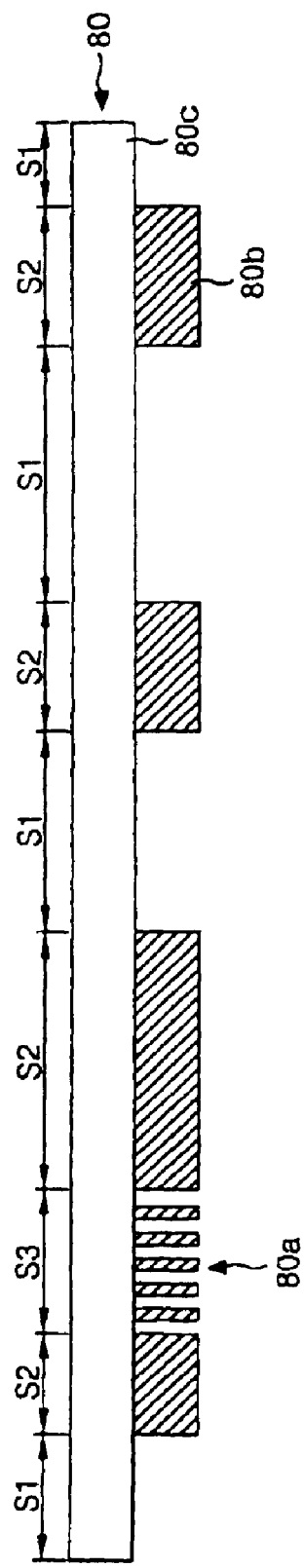
Figure 9A:
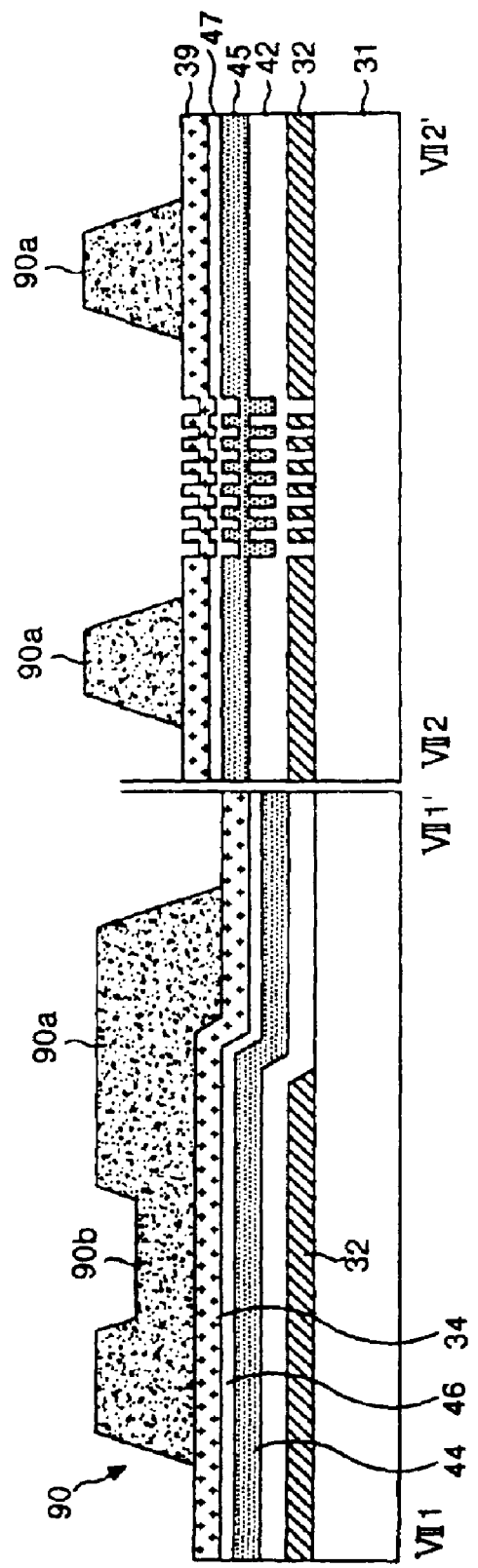

FIGS. 9A to 9D are cross sectional views of an exemplary method of fabricating the lower substrate of FIG. 8B according to the present invention. In FIG. 9A, the gate insulating film 42, the first and second semiconductor layers 45 and 47, and the data metal layer 39 may be sequentially formed on the lower substrate 31. Then, photoresist material(s) may be deposited on an entire surface of the data metal layer 39, and a second mask 80, which may include a halftone mask or a diffractive mask, may be aligned to the lower substrate 31. The second mask 80 may include a partial transmission layer 80a formed at a partial exposure area S3 of a transparent mask substrate 80c, a shielding layer 80b formed at a shielding area S2 of the transparent mask substrate 80c, and a full exposure area S1 of the transparent mask substrate 80c.

Accordingly, the second mask 80 allows full exposure of the photoresist material(s) across the exposure areas S1 of the second mask 80, allows partial exposure of the photoresist material(s) to form a first photoresist pattern 90b corresponding to the partial exposure area S2, and allows no exposure of the photoresist material(s) to form second photoresist patterns 90a corresponding to the shielding area S2. Accordingly, a first height of the second photoresist patterns 90a may be larger than a second height of the first photoresist pattern 90b.

In FIG. 9B, the data metal layer 39 may be patterned by wet etching processes using the first and second photoresist patterns 90a and 90b as a mask, and the first and second semiconductor layers 45 and 47 may be patterned by dry etching processes. Accordingly, the active layer 44, the ohmic contact layer 46, the data line 34, and the data metal pattern 37 may be simultaneously formed during a single patterning process.

In FIG. 9C, the first photoresist pattern 90b may be removed by ashing processes, such as a plasma, and the second photoresist patterns 90a may remain to have a height similar to the first height of the first photoresist pattern 90b.

Figure 9D:
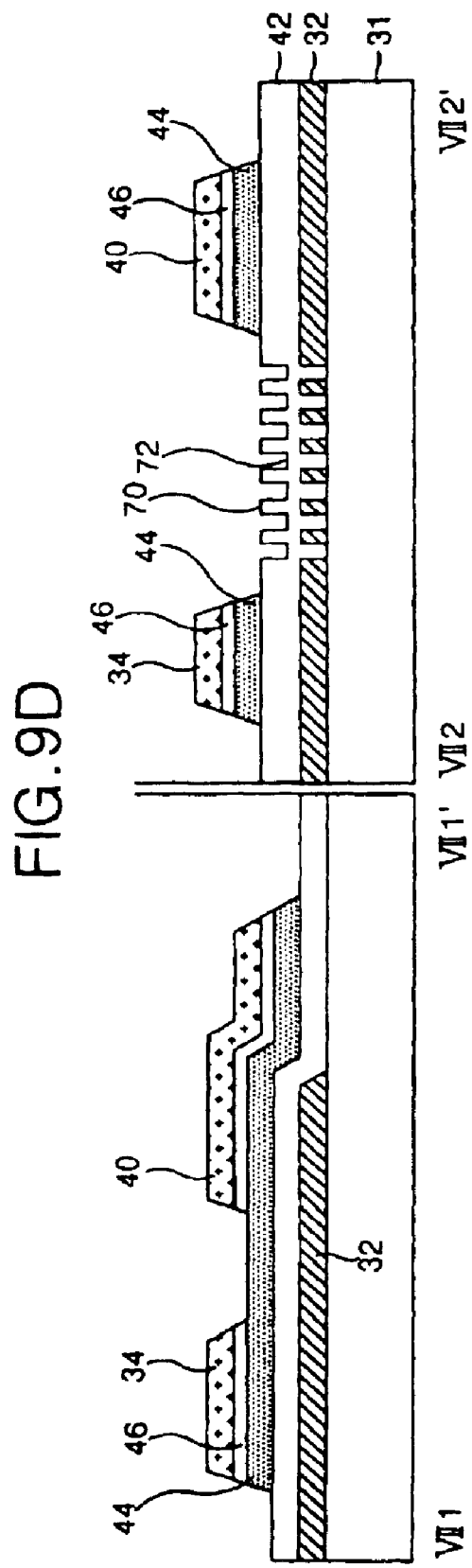

In FIG. 9D, the data line 34 including the source electrode and the drain electrode 40 may be formed by removing parts of the data metal pattern 37 corresponding to the channel part of the TFT by etching processes using the first photoresist patterns 90a. The active layer 44 may be exposed to form a channel by removing the ohmic contact layer 46, which is exposed by the data line 34 and the drain electrode 40, using the second photoresist patterns 90a.

Then, the second photoresist patterns 90a that may remain on the data line 34 and the drain electrode 40 may be removed using a stripping process, for example. Accordingly, a distance between adjacent active layers formed at lower parts of the data line 34 and the drain electrode 40 increases.

The exemplary liquid crystal display device and exemplary method of fabricating a liquid crystal display device according to the present invention may be applied to liquid crystal displays with various channels such U-shaped and L-shaped channels, for example.

It will be apparent to those skilled in the art that various modifications and variations can be made in the liquid crystal display device and method of fabricating a liquid crystal display device of the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a gate line having a bending part in at least one side;
   a data line crossing the gate line on the first substrate;
   a pixel electrode formed at a pixel area defined by the gate line and the data line;
   a drain electrode of a thin film transistor connected to the pixel electrode, the drain electrode having a first part extending along a direction of the gate line and a second part extending at an angle from the first part; and
   a semiconductor layer overlapping at least part of the gate line, the drain electrode, and the data line to form a channel of the thin film transistor,
   wherein the bending part is disposed between the second part of the drain electrode and the data line.

2. The device according to claim 1, further comprising a gate insulating film having a plurality of projections and a plurality of grooves.

3. The device according to claim 2, wherein the bending part of the gate line includes the projections and grooves.

4. The device according to claim 2, further comprising a protective film on an entire surface of the first substrate.

5. The device according to claim 4, wherein the protective film includes a plurality of projections and grooves corresponding to the projections and grooves of the gate insulating film.

6. The device according to claim 1, further comprising an ohmic contact layer on the semiconductor layer.

7. The device according to claim 1, wherein the second part of the drain electrode overlaps an edge portion of the gate line.

8. The device according to claim 7, wherein the data line functions as a semiconductor source region of the thin film transistor.

9. The device according to claim 1, wherein the gate line covers the channel of the thin film transistor.

10. A method of fabricating a liquid crystal display device, comprising steps of:
    forming a gate line having a plurality of dot patterns on a first substrate;
    forming a gate insulating film to cover the gate line on the first substrate;
    forming a semiconductor layer having a first width overlapping a second width of the gate line, the first width less than the second width;
    forming a data line crossing the gate line;
    forming a drain electrode facing the data line, the drain electrode having a first part extending along a direction of the gate line and a second part extending at an angle from the first part with the dot pattern therebetween;
    forming a protective film having a contact hole to expose the drain electrode; and
    forming a pixel electrode on the protective film connected to the drain electrode.

11. The method according to claim 10, wherein the step of forming the gate insulating film includes forming a plurality of projections and a plurality of grooves.

12. The method according to claim 11, wherein the plurality of projections and grooves correspond to the plurality of dot patterns.

13. The method according to claim 12, wherein the protective film includes a plurality of projections and grooves corresponding to the projections and grooves of the gate insulating film.

14. The method according to claim 10, wherein the second part of the drain electrode overlaps an edge portion of the gate line.

15. The method according to claim 14, wherein the data line functions as a semiconductor source region of the thin film transistor.

16. The method according to claim 10, further comprising forming an ohmic contact layer on the semiconductor layer.

17. The method according to claim 10, wherein the rate line covers a channel region of the semiconductor layer.

18. The method according to claim 10, wherein the steps of forming a data line and a drain electrode are performed simultaneously.

19. The method according to claim 18, wherein the simultaneous formation of the data line and the drain electrode includes a mask having a shield portion, a semi-transparent portion, and a full exposure portion.

* * * * *